(12) United States Patent
Lee et al.

(10) Patent No.: US 10,937,808 B2
(45) Date of Patent: Mar. 2, 2021

(54) VERTICAL MEMORY DEVICE AND METHOD OF FABRICATING THE SAME

(71) Applicant: SK hynix Inc., Icheon-si (KR)

(72) Inventors: Jae Gil Lee, Seoul (KR); Ju Ry Song, Suwon-si (KR); Hyangkeun Yoo, Seongnam-si (KR); Se Ho Lee, Yongin-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 16/536,063

(22) Filed: Aug. 8, 2019

(65) Prior Publication Data
US 2020/0212068 A1 Jul. 2, 2020

(30) Foreign Application Priority Data

Dec. 27, 2018 (KR) .......................... 10-2018-0171070

(51) Int. Cl.

| | | |
|---|---|---|
| *H01L 27/11597* | (2017.01) | |
| *H01L 29/423* | (2006.01) | |
| *H01L 29/417* | (2006.01) | |
| *H01L 29/51* | (2006.01) | |
| *H01L 29/66* | (2006.01) | |
| *H01L 29/78* | (2006.01) | |
| *H01L 21/28* | (2006.01) | |

(52) U.S. Cl.
CPC .. *H01L 27/11597* (2013.01); *H01L 29/40111* (2019.08); *H01L 29/41741* (2013.01); *H01L 29/42372* (2013.01); *H01L 29/516* (2013.01); *H01L 29/517* (2013.01); *H01L 29/6684* (2013.01); *H01L 29/66666* (2013.01); *H01L 29/7827* (2013.01); *H01L 29/78391* (2014.09)

(58) Field of Classification Search
CPC ......... H01L 27/11597; H01L 29/42372; H01L 29/41741; H01L 29/516; H01L 29/6684; H01L 29/78391; H01L 29/7827; H01L 29/40111; H01L 29/66666; H01L 29/517
See application file for complete search history.

(56) References Cited

U.S. PATENT DOCUMENTS 9,818,848 B2 11/2017 Sun et al.

FOREIGN PATENT DOCUMENTS

CN 107068686 A * 8/2017

\* cited by examiner

*Primary Examiner* — Syed I Gheyas

(57) ABSTRACT

A vertical memory device according to an aspect includes a substrate, a first gate electrode structure disposed on the substrate and a second gate electrode structure spaced apart from the first gate electrode structure in a first direction substantially perpendicular to the substrate, a channel contact electrode layer disposed between the first gate electrode structure and the second gate electrode structure, and a channel layer extending along the first direction and in contact with the channel contact electrode layers and the first and the second gate electrode structures.

12 Claims, 27 Drawing Sheets

VERTICAL MEMORY DEVICE AND METHOD OF FABRICATING THE SAME

CROSS-REFERENCE TO RELATED APPLICATION

The present application claims priority under 35 U.S.C. 119(a) to Korean Patent Application No. 10-2018-0171070, filed on Dec. 27, 2018, which is herein incorporated by reference in its entirety.

BACKGROUND

1. Technical Field

Various embodiments of the present disclosure generally relate to a semiconductor device and, more particularly, to a memory device having a vertical structure and a method of fabricating the same.

2. Related Art

As the design rule decreases and the degree of integration increases, research on structures of memory devices that can guarantee both structural stability and reliability of storage operation has continued. In a field of memory cells in which random access to stored information is required for each unit cell, various storage cell structures for replacing conventional high aspect ratio capacitors have been studied. As a result of such studies, three-dimensional storage cell structures, such as cross point structures, have recently been proposed.

SUMMARY

An embodiment of the present disclosure provides a memory device capable of ensuring structural reliability and operational reliability and capable of random access.

A vertical memory device according to an aspect of the present disclosure includes a substrate, a first gate electrode structure disposed on the substrate and a second gate electrode structure spaced apart from the first gate electrode structure in a first direction substantially perpendicular to the substrate, each of the first gate electrode structure and the second gate electrode structure including a ferroelectric layer and a gate electrode layer, a channel contact electrode layer disposed between the first gate electrode structure and the second gate electrode structure, and a channel layer extending along the first direction and in contact with the channel contact electrode layers and the gate electrode structures.

An embodiment of the present disclosure provides a method of fabricating a memory device having the features described above. In the method of forming a vertical memory device, a stack structure including a plurality of first interlayer sacrificial layers and a plurality of second interlayer sacrificial layers that are alternately stacked is formed on a substrate along a first direction substantially perpendicular to the substrate. A trench penetrating the stack structure is formed. A channel layer covering a sidewall surface of the trench is formed. The plurality of first interlayer sacrificial layers are selectively removed to form a plurality of first recesses exposing portions of the channel layer. The plurality of first recesses are filled with a conductive material to form a plurality of channel contact electrode layers. The plurality of second interlayer sacrificial layers are selectively removed to a plurality of form second recesses exposing the channel layer. A plurality of interfacial insulation layers are formed on the plurality of channel contact electrode layers and the channel layer in the a plurality of second recesses. A plurality of ferroelectric layers and a plurality of gate electrode layers are sequentially formed on the plurality of interfacial insulation layers.

DETAILED DESCRIPTION

Figure 1:
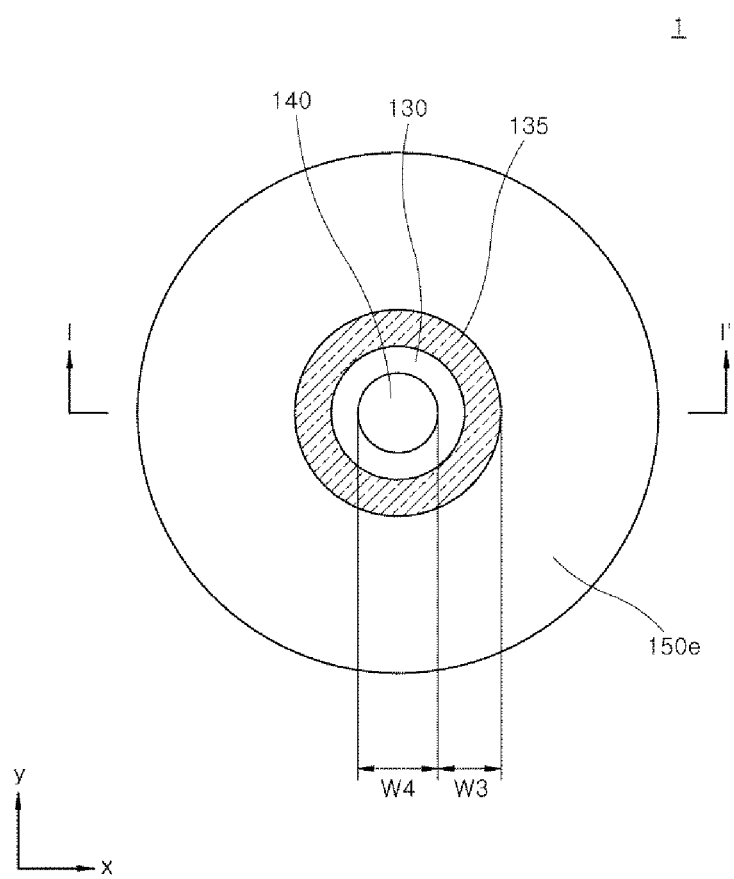
FIG. 1 is a plan view schematically illustrating a vertical memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

Figure 2:
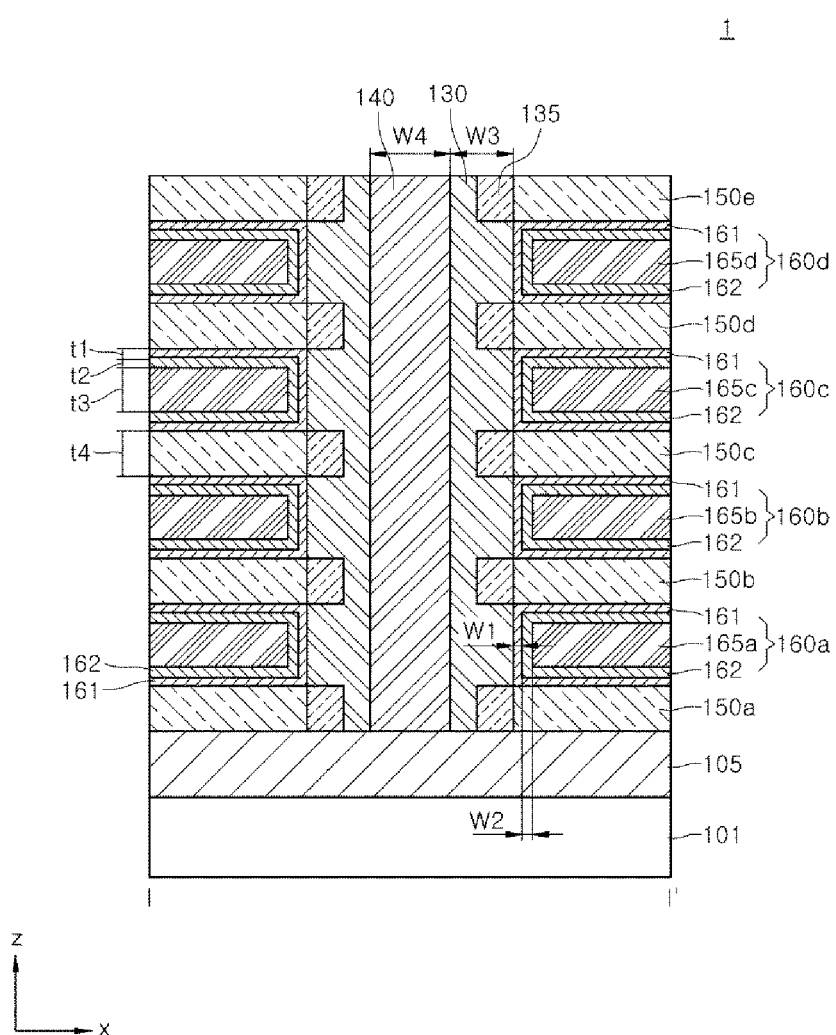
FIG. 2 is a cross-sectional view schematically illustrating a vertical memory device according to an embodiment of the present disclosure.
Figure 3:
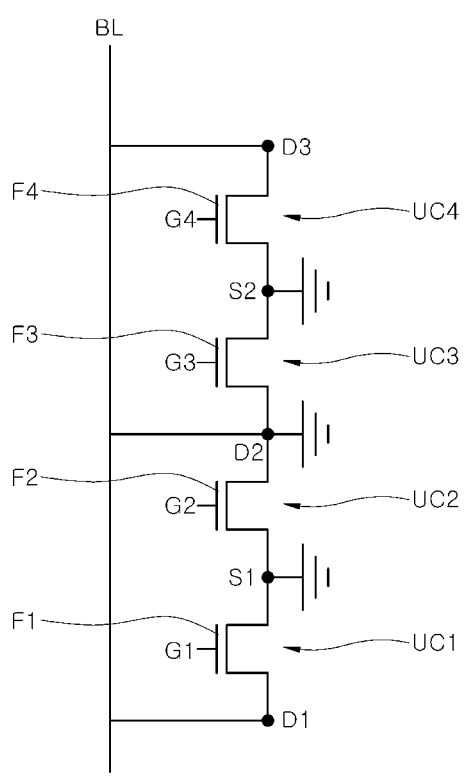
FIG. 3 is a circuit diagram of a vertical memory device according to an embodiment of the present disclosure.

Further, in performing a method or a fabricating method, each process constituting the method can take place differently from the stipulated order unless a specific sequence is described explicitly in the context. In other words, each process may be performed in the same manner as stated order, may be performed substantially at the same time, or may be performed in a reverse order.

FIG. 1 is a plan view schematically illustrating a vertical memory device according to an embodiment of the present disclosure. FIG. 2 is a cross-sectional view schematically illustrating the vertical memory device illustrated in FIG. 1. Specifically, FIG. 2 is a cross-sectional view taken along the line I-I' of the vertical memory device of FIG. 1. FIG. 3 is a circuit diagram of the vertical memory device according to in an embodiment of the present disclosure.

Referring to FIGS. 1 and 2, the vertical memory device 1 may include a substrate 101, gate electrode structures 160a, 160b, 160c and 160d, channel contact electrode layers 150a, 150b, 150c, 150d and 150e, and a channel layer 130 disposed over the substrate 101. The channel layer 130 may further include channel doping regions 135 formed in regions in contact with the channel contact electrode layers 150a, 150b, 150c, 150d and 150e. In addition, the vertical memory device 1 may include a base insulation layer 105 and a filling insulation layer 140 for effective electrical insulation between neighboring thin films.

The vertical memory device 1 may be disposed such that the channel layer 130 surrounds filling insulation layer 140, which is disposed over substrate 101. The filling insulation layer 140 may take any shape, such as, for example, a substantially ellipsoidal columnar or a substantially cylindrical shape. In addition, the channel contact electrode layers 150a, 150b, 150c, 150d and 150e and the gate electrode structures 160a, 160b, 160c and 160d may be disposed around or to surround the channel layer 130. For example, the channel contact electrode layers 150a, 150b, 150c, 150d and 150e and the gate electrode structures 160a, 160b, 160c and 160d may be alternately layered over substrate 101, and channel layer 130 may penetrate through the layers in a substantially vertical direction.

Referring to FIG. 2, the substrate 101 may be a semiconductor substrate. The semiconductor substrate may, for example, be a silicon (Si) substrate, a gallium arsenic (GaAs) substrate, an indium phosphide (InP) substrate, a germanium (Ge) substrate, or a silicon germanium (SiGe) substrate. In an embodiment, the semiconductor substrate may be doped into n-type or p-type to have predetermined conductivity. In another embodiment, the substrate 101 may be an insulative substrate like a silicon-on-insulator (SOI) substrate. In yet another embodiment, the substrate 101 may be a conductive substrate like a metal substrate.

The base insulation layer 105 may be disposed on the substrate 101. The base insulation layer 105 can electrically insulate the lowermost layer 150a of the channel contact electrode layers 150a, 150b, 150c, 150d and 150e and the substrate 101 from each other. In addition, the base insulation layer 105 can electrically insulate the channel layer 130 and the substrate 101 from each other. The base insulation layer 105 may, for example, include oxide, nitride or oxynitride. The base insulation layer 105 may, for example, be a silicon oxide layer, a silicon nitride layer, or a silicon oxynitride layer.

In some embodiments not illustrated herein, when the substrate 101 is an insulative substrate, the base insulation layer 105 can be omitted. In some other embodiments (not illustrated herein), one or more circuit pattern layers and one or more insulation layers for insulating the circuit pattern layers may be disposed between the substrate 101 and the base insulation layer 105. Accordingly, various active devices or passive devices including circuit pattern layers and insulation layers may be disposed between the substrate 101 and the base insulation layer 105.

Referring to FIG. 2, the gate electrode structures 160a, 160b, 160c and 160d may be arranged apart from each other in a first direction perpendicular to the substrate 101, for example, in a vertical or z-direction. The gate electrode structures 160a, 160b, 160c and 160d may be disposed in contact with the channel layer 130 in a direction that is not parallel to the first direction, for example, in a second direction substantially orthogonal to the first direction, such as a horizontal or x-direction. The channel contact electrode layers 150a, 150b, 150c, 150d and 150e may be disposed between the gate electrode structures 160a, 160b, 160c and 160d along the first direction.

In FIG. 2, although four gate electrode structures, that is, the first to fourth gate electrode structures 160a, 160b, 160c and 160d are illustrated as the gate electrode structures, the number of the gate electrode structures is not limited. Likewise, although five channel contact electrode layers, that is, the first to fifth channel contact electrode layers 150a, 150b, 150c, 150d and 150e are illustrated as the channel contact electrode layers, the number of the channel contact electrode layers is not limited.

The gate electrode structures 160a, 160b, 160c and 160d may each include an interfacial insulation layer 161 and a ferroelectric layer 162. The gate electrode structures 160a, 160b, 160c and 160d include a gate electrode layer, namely gate electrode layers 165a, 165b, 165c and 165d, respectively. The interfacial insulation layers 161 may be disposed in contact with the channel contact electrode layers 150a, 150b, 150c, 150d and 150e and the ferroelectric layers 162 with respect to the first direction, and may be disposed in contact with the channel layer 130 and the ferroelectric layers 162 with respect to the second direction. The interfacial insulation layers 161 and the ferroelectric layers 162 may function to electrically insulate the channel contact electrode layers 150a, 150b, 150c, 150d and 150e from the gate electrode layers 165a, 165b, 165c and 165d with respect to the first direction. The interfacial insulation layers 161 may be disposed between the channel layer 130 and the ferroelectric layers 162 with respect to the second direction so that the interfacial insulation layers 161 can function to decrease a concentration of defective sites generated at an interface between the channel layer 130 and the ferroelectric layers 162 by preventing direct contact between the channel layer 130 and the ferroelectric layers 162. The interfacial insulation layers 161 may, for example, include silicon oxide, silicon nitride, silicon oxynitride or aluminum oxide.

The ferroelectric layers 162 may be disposed between the interfacial insulation layers 161 and the gate electrode layers 165a, 165b, 165c and 165d. At least a portion of each of the ferroelectric layers 162 is disposed between the channel contact electrode layer 150a, 150b, 150c, 150d and 150e and the gate electrode layer 165a, 165b, 165c and 165d with respect to the first direction. At least a portion of each of the ferroelectric layers 162 is disposed between the channel layer 130 and the gate electrode layer 165a, 165b, 165c and 165d with respect to the second direction.

The ferroelectric layers 162 can store remanent polarization generated in the ferroelectric layers 162 by a polarization write voltage applied between the gate electrode layers 165a, 165b, 165c and 165d and the channel layer 130. Signal information may be stored in a non-volatile manner in remanent polarization in the ferroelectric layers. That is, the ferroelectric layers 162 can function as nonvolatile memory layers.

The ferroelectric layers 162 may each, for example, include hafnium oxide, zirconium oxide, hafnium zirconium oxide, or a combination of two or more thereof, but it is not necessarily limited thereto and various other ferroelectric materials can be applied or included. As an example, the ferroelectric layers 162 may each include ferroelectric materials having a perovskite structure such as $PZT(PbZr_xTi_{1-x}O_3)$, $BaTiO3$, $PbTiO3$ or the like. The ferroelectric layers 162 may each include at least one dopant selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La). Each of the ferroelectric layers 162 may have a crystalline structure. As an example, each of the ferroelectric layers 162 may have a crystal structure of an orthorhombic system.

The gate electrode layers 165a, 165b, 165c and 165d may be disposed on a ferroelectric layer 162 in the respective gate electrode structures. The gate electrode layers 165a, 165b, 165c and 165d may contact one or more surfaces of the respective ferroelectric layers 162. The gate electrode layers 165a, 165b, 165c and 165d may each include a conductive material. As an example, the conductive material may include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In an embodiment, the gate electrode structures 160a, 160b, 160c and 160d, including the respective ferroelectric layers 162, may constitute first to fourth unit memory cells UC1, UC2, UC3 and UC4, respectively, in the circuit diagram of FIG. 3. Here, the first to fourth gate electrode layers 165a, 165b, 165c and 165d of the gate electrode structures 160a, 160b, 160c and 160d may each be connected to different word lines. Accordingly, different gate voltages can be independently applied to the first to fourth gate electrode layers 165a, 165b, 165c and 165d.

The channel contact electrode layers 150a, 150b, 150c, 150d and 150e may be disposed apart from each other in the first direction over the substrate 101. The channel contact electrode layers 150a, 150b, 150c, 150d and 150e may be disposed between each of the gate electrode structures 160a, 160b, 160c and 160d, respectively, along the first direction. The channel contact electrode layers 150a, 150b, 150c, 150d and 150e may each include a conductive material. As an example, the conductive material may include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In an embodiment, referring to FIG. 2, the first channel contact electrode layer 150a disposed between the first gate electrode structure 160a and substrate 101 can function as a drain electrode layer. The second channel contact electrode layer 150b disposed on the first gate electrode structure 160a can function as a source electrode layer. In addition, the second channel contact electrode layer 150b can function as a source electrode layer with respect to the second gate electrode structure 160b. Accordingly, the third channel contact electrode layer 150c disposed on the second gate electrode structure 160b can function as a drain electrode layer with respect to the second gate electrode structure 160b. Likewise, the third channel contact electrode layer 150c and the fourth channel contact electrode layer 150d can function as the drain electrode layer and the source electrode layer, respectively, with respect to the third gate electrode structure 160c. Further, the fourth channel contact electrode layer 150d and the fifth channel contact electrode layer 150e can function as the source electrode layer and the drain electrode layer, respectively, with respect to the fourth gate electrode structure 160d.

FIG. 3 represents an electric circuit of a structure of the cross-sectional view of FIG. 2. In FIG. 3, the first to fourth unit memory cells UC1, UC2, UC3 and UC4 may each be a transistor-type ferroelectric memory device having a corresponding ferroelectric layer among the ferroelectric layers F1, F2, F3 and F4 and a corresponding gate electrode among the gate electrodes G1, G2, G3 and G4. The first and second unit memory cells UC1 and UC2 may share a source electrode S1 and may have separate drain electrodes D1 and D2, respectively. The third and fourth unit memory cells UC3 and UC4 may share a source electrode S2 and may have separate drain electrodes D2 and D3, respectively. Here, the source electrodes S1 and S2 may be connected to a ground line, and the drain electrodes D1, D2, and D3 may be connected to a bit line BL. The gate electrodes G1, G2, G3 and G4 may be connected to different word lines (not illustrated herein). Accordingly, separate gate voltages may be applied to the gate electrodes G1, G2, G3 and G4, respectively.

As a result, the unit memory cells UC1, UC2, UC3 and UC4 have the source electrodes S1 and S2 and the drain electrodes D1, D2, and D3, respectively, and the gate voltage applied to the corresponding gate electrodes G1, G2, G3 and G4 are independently controlled to individually connect to signal information stored in the ferroelectric layers F1, F2, F3 and F4. That is, the vertical memory device 1 can implement a random access operation to the unit memory cells UC1, UC2, UC3 and UC4.

Referring to FIG. 2, the first channel contact electrode layer 150a, the third channel contact electrode layer 150c and the fifth channel contact electrode layer 150e can correspond to the drain electrodes D1, D2 and D3 of FIG. 3. Similarly, the second channel contact electrode layer 150b and the fourth channel contact electrode layer 150d can correspond to the source electrodes S1 and S2 of FIG. 3.

In some other embodiments, unlike illustrated in FIGS. 2 and 3, the first channel contact electrode layer 150a, the third channel contact electrode layer 150c and the fifth channel contact electrode layer 150e can function as the source electrodes, and the second channel contact electrode layer 150b and the fourth channel contact electrode layer 150d can function as the drain electrodes. In this case, the first channel contact electrode layer 150a, the third channel contact electrode layer 150c and the fifth channel contact electrode layer 150e, which correspond to the source electrodes, may be connected to the ground line, and the second channel contact electrode layer 150b and the fourth channel contact electrode layer 150d may be connected to the bit line.

Referring to FIGS. 1 and 2 again, the channel layer 130 may be disposed to extend along the first direction with substantially circular or elliptical perimeters in cross-sections. The channel layer 130 may be disposed to contact the channel contact electrode layers 150a, 150b, 150c, 150d and 150e and the gate electrode structures 160a, 160b, 160c and 160d. The channel layer 130 may be connected to a predetermined conductive line (not illustrated herein), and controlled to have a predetermined electric potential. The channel layer 130 may include a semiconductor material. The semiconductor material may include silicon (Si), germanium (Ge), gallium arsenic (GaAs), silicon germanium (SiGe), silicon carbide (SiC), gallium nitride (GaN), indium gallium arsenic (InGaAs), and/or indium gallium zinc oxide (inGaZn oxide; IGZO) as non-limiting examples. In an embodiment, the channel layer 130 may be doped into n-type and/or p-type to have predetermined conductivity.

The channel layer 130 may include channel doping regions 135 disposed in at least one region in contact with the channel contact electrode layers 150a, 150b, 150c, 150d and 150e. The channel doping regions 135 may be doped. In an embodiment, when the channel layer 130 is doped into n-type or p-type, the channel doping regions 135 may be doped into an opposite type of the channel layer 130. As an example, when the channel layer 130 is doped into n-type, the channel doping regions 135 may be doped into p-type. As another example, when the channel layer 130 is doped into p-type, the channel doping regions 135 may be doped into n-type.

In an embodiment, when the first channel contact electrode layer 150a, the third channel contact electrode layer 150c and the fifth channel contact electrode layer 150e function as the drain electrodes (e.g., D1, D2 and D3 in FIG. 3), the channel doping regions 135 in contact with the first channel contact electrode layer 150a, the third channel contact electrode layer 150c and the fifth channel contact electrode layer 150e can function as drain regions of transistors constituting the unit memory cells U1, U2, U3 and U4. In addition, when the second channel contact electrode layer 150b and the fourth channel contact electrode layer 150d function as the source electrodes S1 and S2, the second channel contact electrode layer 150b and the fourth channel contact electrode layer 150d can function as source regions of transistors constituting the unit memory cells U1, U2, U3 and U4 of FIG. 3.

Referring to FIG. 1, the filling insulation layer 140 may be disposed to be surrounded by a tube-like or pipe-like the channel layer 130 along the first direction. For example, the filling insulation layer 140 may have an ellipsoidal columnar shape or a cylindrical shape. The filling insulation layer 140 may, for example, include oxide, nitride or oxynitride. In some other embodiments, a width W3 of the channel layer 130 including the channel doping region 135 may be increased to eliminate the region of the filling insulation layer 140. That is, the filling insulation layer may not exist. Instead, the channel layer 130 may extend into the space where the filling insulation layer 140 is disposed.

Referring to FIG. 2, each of the interfacial insulation layers 161 may have a thickness t1 of 0.5 to 5 nanometer (nm) along the first direction, for example, the z-direction, and have a width w1 of 0.5 to 5 nanometer (nm) along a second or a third direction, for example, the x-direction or the y-direction. Each of the ferroelectric layers 162 may have a thickness t2 of 3 to 20 nanometer (nm) along the z-direction, and have a width w2 of 3 to 20 nanometer (nm) along the x-direction or y-direction. The gate electrode layers 165a, 165b, 165c and 165d may each have a thickness t3 of 5 to 50 nanometer (nm) along the z-direction. The channel contact electrode layers 150a, 150b, 150c, 150d and 150e may each have a thickness t4 of 5 to 50 nanometer (nm) along the z-direction. Meanwhile, referring to FIGS. 1 and 2, the channel layer 130 may have a width W3 of 5 to 20 nanometer (nm). The filling insulation layer 140 may have a width W4 of 200 nanometer (nm) or less. In some embodiments, the width W3 of the channel layer 130 including the channel doping region 135 may be increased to remove the region of the filling insulation layer 140. That is, the filling insulation layer may not exist. Instead, the channel layer 130 may extend into the space where the filling insulation layer 140 is disposed.

Figure 4:
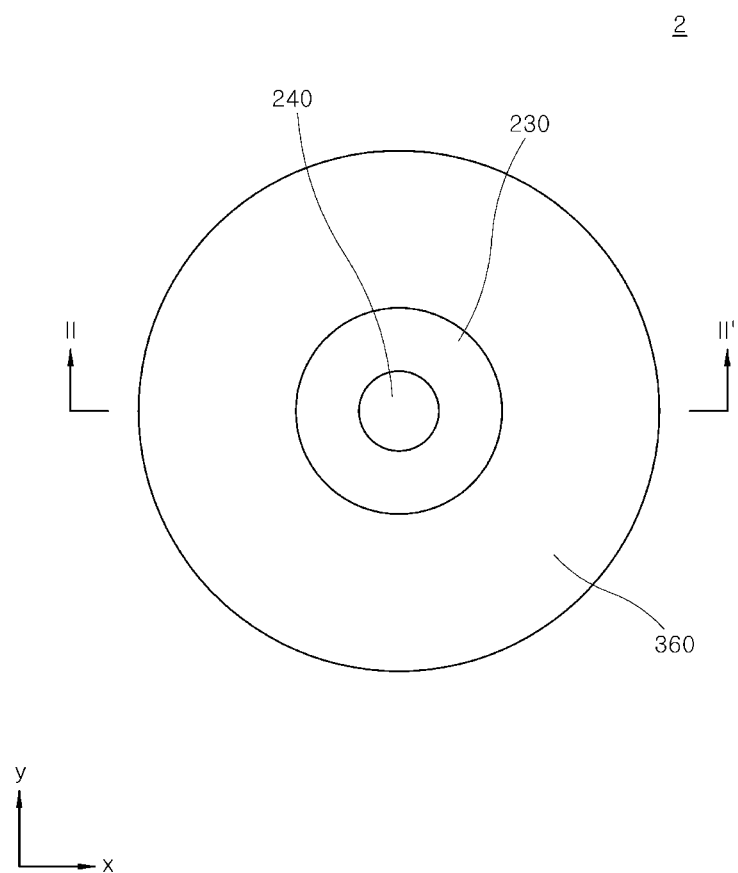
FIG. 4 is a plan view schematically illustrating a vertical memory device according to an embodiment of the present disclosure.
Figure 5:
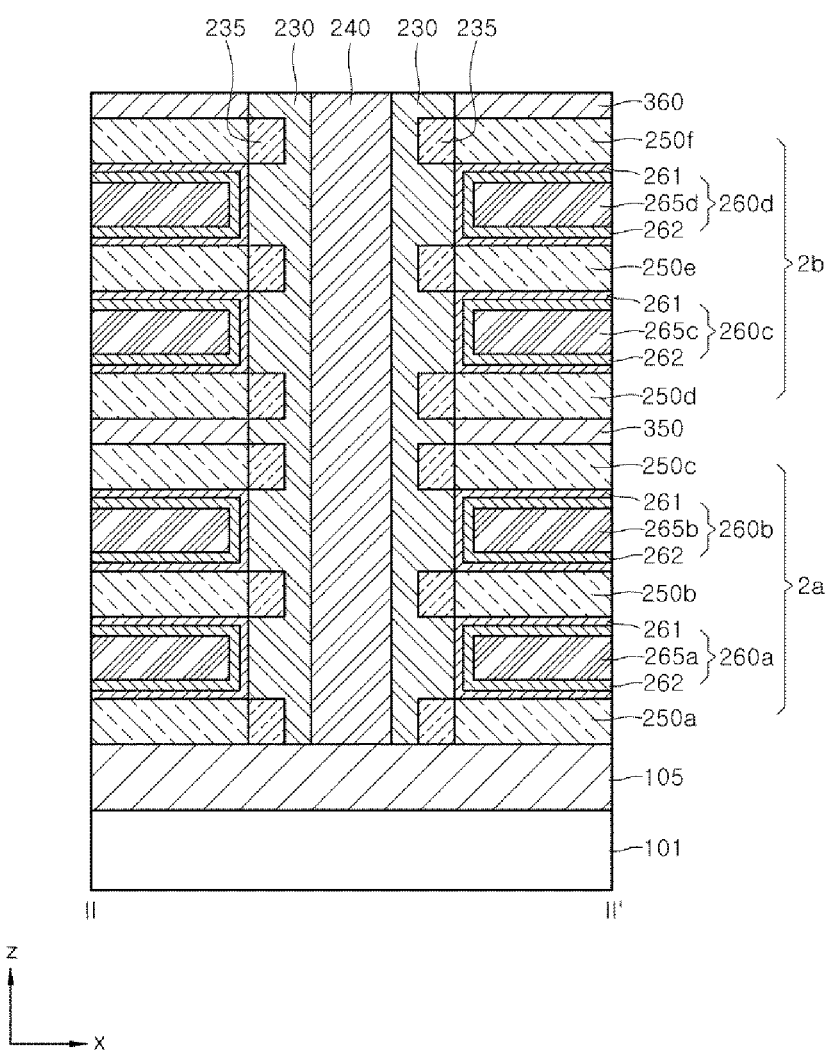
FIG. 5 is a cross-sectional view schematically illustrating a vertical memory device according to an embodiment of the present disclosure.

FIG. 4 is a plan view schematically illustrating a vertical memory device according to an embodiment of the present disclosure. FIG. 5 is a cross-sectional view schematically illustrating the vertical memory device illustrated in FIG. 4. Specifically, FIG. 5 is a cross-sectional view taken along the line II-II' of the vertical memory device of the plan view of FIG. 4.

Referring to FIGS. 4 and 5, the vertical memory device 2 may include a substrate 101, first to fourth gate electrode structures 260a, 260b, 260c and 260d, first to sixth channel contact electrode layers 250a, 250b, 250c, 250d, 250e and 250f and a channel layer 230 that are disposed over the substrate 101. The channel layer 230 may further include channel doping regions 235 formed in regions in contact with the first to sixth channel contact electrode layers 250a, 250b, 250c, 250d, 250e and 250f. The first to fourth gate electrode structures 260a, 260b, 260c and 260d may each have an interfacial insulation layer 261 and a ferroelectric layer 262. In addition, the first to fourth gate electrode structures 260a, 260b, 260c and 260d may have corresponding first to fourth gate electrode layers 265a, 265b, 265c and 265d, respectively.

In an embodiment, the vertical memory device 2 may further include first and second device insulation layers 350 and 360 for electrically insulating unit memory cells disposed along a first direction, for example, the z-direction, as compared with the vertical memory device 1 described above and with reference to FIGS. 1 to 3.

The first device insulation layer 350 may electrically insulate the third channel contact electrode layer 250c and the fourth channel contact electrode layer 250d, and the second device insulation layer 360 may electrically insulate the sixth channel contact electrode layer 250f and other channel contact electrode layer (not illustrated herein) disposed over the sixth channel contact electrode layer 250f. Accordingly, a first memory cell group 2a including the first and second gate electrode structures 260a and 260b and the first to third channel contact electrode layers 250a, 250b and 250c and a second memory cell group 2b including the third and fourth gate electrode structures 260c and 260d and the fourth to sixth channel contact electrode layers 250d, 250e and 250f can be effectively and electrically separated from each other by the first device insulation layer 350. In addition, the second memory cell group 2b including the third and fourth gate electrode structures 260c and 260d and the fourth through sixth channel contact electrode layers 250d, 250e and 250f and an additional memory cell group (not illustrated) over the second memory cell group 2b can be effectively and electrically separated from each other by the second device insulation layer 360.

The first device insulation layer 350 may have substantially the same width as the third and fourth channel contact electrode layers 250c and 250d and may be disposed in contact with the channel layer 230 along the second direction, or x-direction in FIG. 5. Likewise, the second device insulation layer 360 may have substantially the same width as the sixth channel contact electrode layer 250f and may be disposed in contact with the channel layer 230 along the x-direction. Each of the first and second device insulation layers 350 and 360 may, for example, include oxide, nitride or oxynitride. As an example, each of the first and second device insulation layers 350 and 360 may be a silicon oxide layer, a silicon nitride layer or a silicon oxynitride layer.

Although, in FIG. 5, the number of the gate electrode structures included in each of the first and second memory cell groups 2a and 2b is set to two and the number of the channel contact electrode layers is set to three, respectively, it is not necessarily limited thereto. In some other embodiments, the number of the gate electrode structures included in each of the first and second memory cell groups 2a and 2b may be set to one and the number of the channel contact electrode layers may be set to two, respectively. In some other embodiments, the number of the gate electrode structures included in each of the first and second memory cell groups 2a and 2b may be set to four and the number of the channel contact electrode layers may be set to five, respectively. As contemplated by the present disclosure, the number of the gate electrode structures and the number of the channel contact electrode layers included in each memory cell group can be variously modified.

The configurations of the first to fourth gate electrode structures 260a, 260b, 260c and 260d may be substantially the same as the configurations of the first to fourth gate electrode structures 160a, 160b, 160c and 160d described above and with reference to FIGS. 1 to 3. That is, the configurations of the interfacial insulation layers 261, the ferroelectric layers 262 and the first to fourth gate electrode structures 260a, 260b, 260c and 260d may be substantially the same as the configurations of the interfacial insulation layers 161, the ferroelectric layers 162 and the first to fourth gate electrode structures 160a, 160b, 160c and 160d described above and with reference to FIGS. 1 to 3. The configurations of the channel layer 230 and the filling insulation layer 240 may be substantially the same as the configurations of the channel layer 130 and the filling insulation layer 140 described above and with reference to FIGS. 1 to 3.

Figure 6:
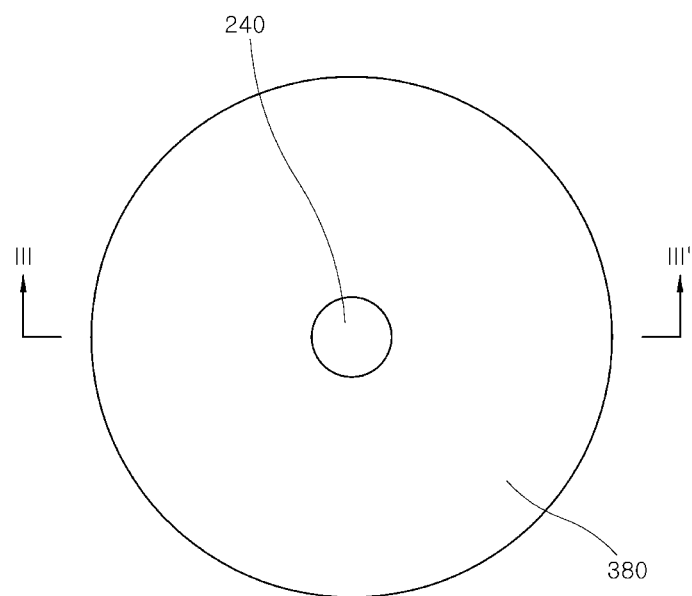
FIG. 6 is a plan view schematically illustrating a vertical memory device according to an embodiment of the present disclosure.
Figure 7:
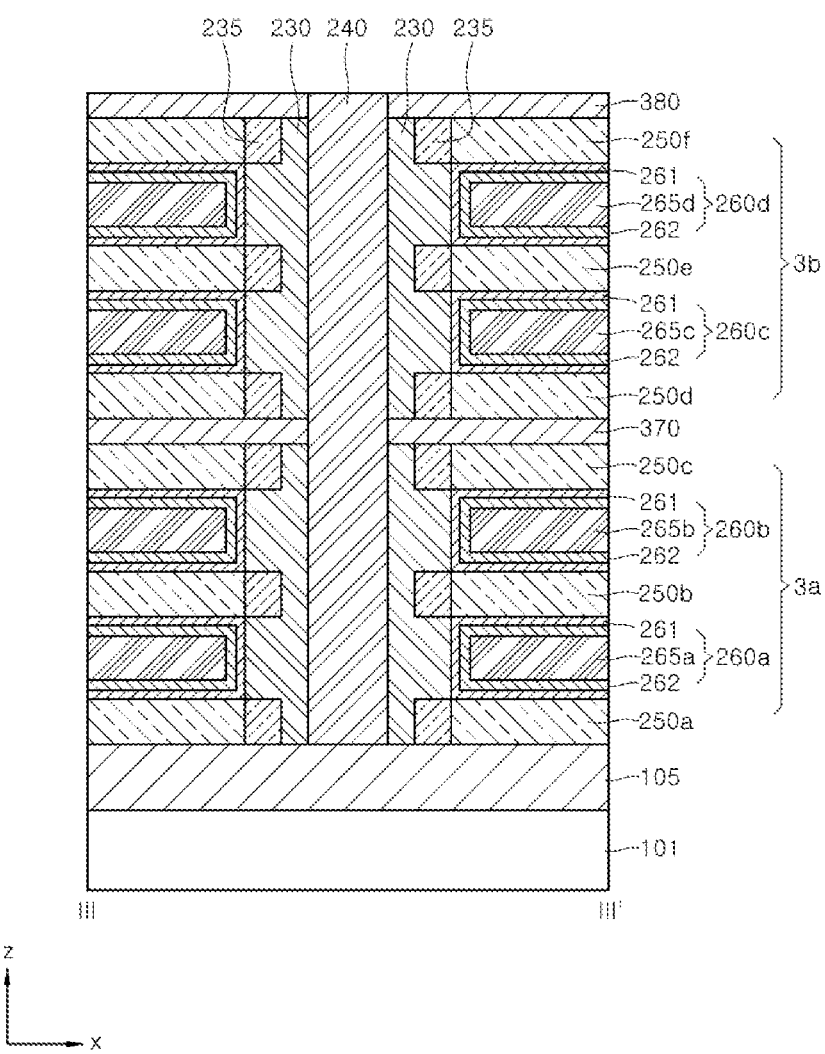
FIG. 7 is a cross-sectional view schematically illustrating a vertical memory device according to an embodiment of the present disclosure.

FIG. 6 is a plan view schematically illustrating a vertical memory device according to an embodiment of the present disclosure. FIG. 7 is a cross-sectional view schematically illustrating the vertical memory device illustrated in FIG. 6.

Referring to FIGS. 6 and 7, the configuration of the vertical memory device 3 may be substantially the same as the configuration of the vertical memory device 2 described above with reference to FIGS. 4 and 5, except for the configurations of first and second device insulation layers 370 and 380. The vertical memory device 3 may include a first memory cell group 3a and a second memory cell group 3b.

The first device insulation layer 370 may be disposed between a third channel contact electrode layer 250c and a fourth channel contact electrode layer 250d to electrically insulate the third channel contact electrode layer 250c and the fourth channel contact electrode layer 250d in a first direction perpendicular to a substrate 101. The second device insulation layer 380 may be disposed on a sixth channel contact electrode layer 250f to electrically insulate the sixth channel contact electrode layer 250f and another channel contact electrode layer (not illustrated herein) disposed over the sixth channel contact electrode layer 250f in the first direction. Here, the first and second device insulation layers 370 and 380 may extend to penetrate the channel layer 230 and to reach the filling insulation layer 240 in the second direction.

Accordingly, in an embodiment, a portion of the channel layer 230, common to a first memory cell group 2a, and a portion of the channel layer 230, common to a second memory cell group 2b, can be physically isolated from each other. Although not illustrated herein, the isolated portions of the channel layer 230 may be connected to each other through a separate conductive line (not illustrated herein). Accordingly, it is possible to control the channel layer 230 to maintain the same electric potential as a whole.

FIGS. 8 to 15 are cross-sectional views schematically illustrating a method of fabricating a vertical memory device according to an embodiment of the present disclosure. The method of fabricating the vertical memory device described below with reference to FIGS. 8 to 15 may be applied to a method of fabricating the vertical memory device 1 described above and with reference to FIGS. 1 to 3.

Figure 8:
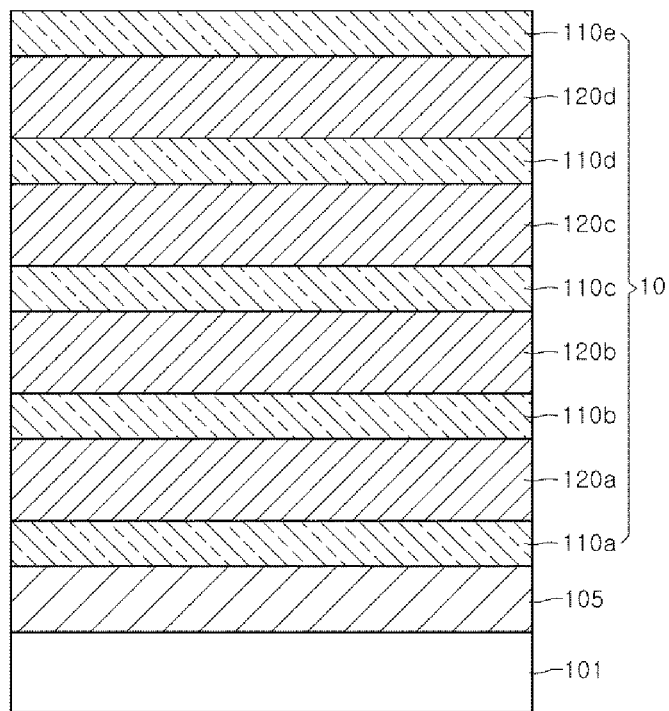
FIGS. 8 to 15 are cross-sectional views schematically illustrating a method of fabricating a vertical memory device according to an embodiment of the present disclosure.

Referring to FIG. 8, a substrate 101 may be provided. The substrate 101 may be a semiconductor substrate. The semiconductor substrate may, for example, be a silicon (Si) substrate, a gallium arsenic (GaAs) substrate, an indium phosphide (InP) substrate, a germanium (Ge) substrate, or a silicon germanium (SiGe) substrate. In an embodiment, the semiconductor substrate may be doped into n-type or p-type to have conductivity. In another embodiment, the substrate 101 may be an insulative substrate like a silicon-on-insulator (SOI) substrate. In yet another embodiment, the substrate 101 may be a conductive substrate like a metal substrate.

A base insulation layer 105 may be formed on the substrate 101. The base insulation layer 105 may, for example, include oxide, nitride, or oxynitride. The base insulating layer 105 may, for example, be a silicon oxide layer, a silicon nitride layer, or a silicon oxynitride layer. The base insulation layer 105 may be formed by a coating method, a chemical vapor deposition method, or an atomic layer deposition method, for example.

In some other embodiments not illustrated herein, when the substrate 101 is an insulative substrate, the base insulation layer 105 may be omitted. In some other embodiments not illustrated herein, at least one or more circuit pattern layers and one or more insulation layers for insulating the circuit pattern layers may be formed between the substrate 101 and the base insulation layer 105 by known methods. Accordingly, various well-known active devices or passive devices including circuit pattern layers and insulation layers may be formed between the substrate 101 and the base insulation layer 105.

Referring to FIG. 8 again, a stack structure 10 may be formed on the base insulation layer 105. The stack structure 10 may include first interlayer sacrificial layers 110a, 110b, 110c, 110d and 110e and second interlayer sacrificial layers 120a, 120b, 120c and 120d, which are stacked alternately along a first direction, for example, the z-direction perpendicular to the substrate 101. The first interlayer sacrificial layers 110a, 110b, 110c, 110d and 110e and the second interlayer sacrificial layers 120a, 120b, 120c and 120d may have etch selectivity with respect to each other. As an example, when the first interlayer sacrificial layers 110a, 110b, 110c, 110d and 110e include oxide, the second interlayer sacrificial layers 120a, 120b, 120c and 120d may include nitride, silicon (Si) or the like. As another example, when the first interlayer sacrificial layers 110a, 110b, 110c, 110d and 110e include nitride, the second interlayer sacrificial layers 120a, 120b, 120c and 120d may include oxide, silicon (Si) or the like. As yet another example, when the first interlayer sacrificial layers 110a, 110b, 110c, 110d and 110e include silicon (Si), the second interlayer sacrificial layers 120a, 120b, 120c and 120d may include oxide, nitride or the like.

In an embodiment, a lowermost layer of the stack structure 10, which contacts the base insulation layer 105, and an uppermost layer of the stack structure 10 may be the first interlayer sacrificial layers 110a and 110e, respectively. Here, the lowermost first interlayer sacrificial layer 110a may have etch selectivity with respect to the base insulation layer 105. In some other embodiments, the numbers of the first interlayer sacrificial layers and the second interlayer sacrificial layers can be variously modified. However, also in this case, the lowermost layer and the uppermost layer of the stack structure 10 may be first interlayer sacrificial layers. The first and second interlayer sacrificial layers may be formed, for example, by a chemical vapor deposition method or an atomic layer deposition method.

Figure 9:
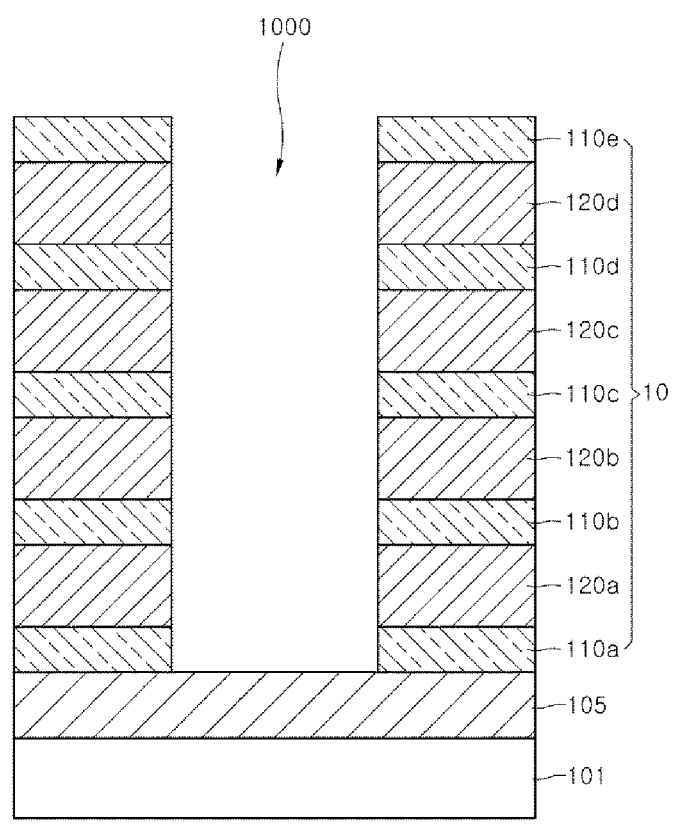

Referring to FIG. 9, a trench 1000 may be formed to penetrate the stack structure 10 to reach the substrate 101 or base insulation layer 105. Along a sidewall surface of the trench 1000, the first interlayer sacrificial layers 110a, 110b, 110c, 110d and 110e and the second interlayer sacrificial layers 120a, 120b, 120c and 120d can be exposed. The base insulation layer 105 may be exposed along a bottom surface of the trench 1000. The trench 1000 may, for example, have a circular or elliptical planar shape. The trench 1000 may be formed by an anisotropic etching method.

Figure 10:
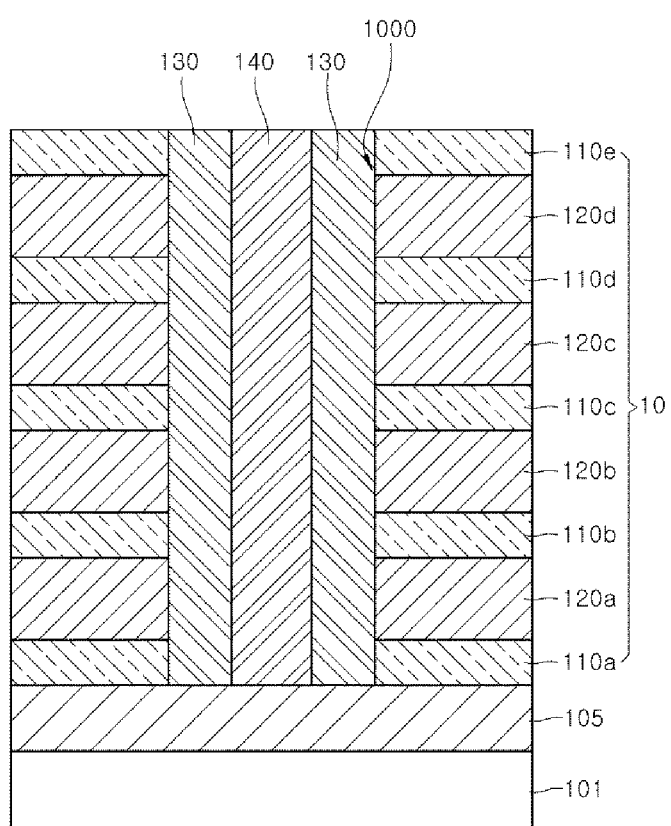

Referring to FIG. 10, a channel layer 130 may be formed to cover the sidewall surface of the trench 1000. That is, the channel layer 130 may be formed on the side surfaces of the first interlayer sacrificial layers 110a, 110b, 110c, 110d and 110e and the second interlayer sacrificial layers 120a, 120b, 120c and 120d, which are exposed along the sidewall surface of the trench 1000. The channel layer 130 may include a semiconductor material. The semiconductor material may include silicon (Si), germanium (Ge), gallium arsenic (GaAs), silicon germanium (SiGe), silicon carbide (SiC), gallium nitride (GaN), indium gallium arsenic (InGaAs), indium gallium zinc oxide (InGaZn oxide; IGZO) and so on. In an embodiment, the channel layer 130 may be doped into n-type or p-type to have predetermined conductivity.

In an embodiment, the channel layer 130 may be formed as follows. A semiconductor material layer is formed along the sidewall surface and the bottom surface of the trench 1000. The semiconductor material layer may be formed, for example, by a chemical vapor deposition method or an atomic layer deposition method. Here, the semiconductor material layer may also be formed on the first interlayer sacrificial layer 110e outside the trench 1000. Then, the semiconductor material layer is anisotropically etched-back to selectively remove the semiconductor material layer in the trench to expose the bottom surface of the trench 1000 and the semiconductor material layer formed on the first interlayer sacrificial layer 110e outside the trench 1000. As a result, a tube-like channel layer 130 can be formed on the sidewall surface and within the trench 1000.

In an embodiment, the trench 1000, in which the channel layer 130 is formed, may be filled with an insulative material. The trench 1000 may be filled with the insulative material using, for example, a coating method, a chemical vapor deposition method, an atomic layer deposition method and so on. Then, the insulative material formed outside of the trench 1000 may be selectively removed to form a filling insulation layer 140. As a method of selectively removing the insulative material, a chemical mechanical polishing method or an etch-back method can be applied, for example. The filling insulation layer 140 may have, for example, an elliptical or a circular columnar shape along the first direction, for example, the z-direction. The filling insulation layer 140 may, for example, include oxide, nitride, or oxynitride.

In some other embodiments, when the trench 1000 is designed to have a sufficiently small diameter, the trench 1000 may be filled only by the channel layer 130. Accordingly, the process of forming the filling insulation layer 140, including the etching back of channel layer 130 within the trench 1000, can be omitted.

Figure 11:
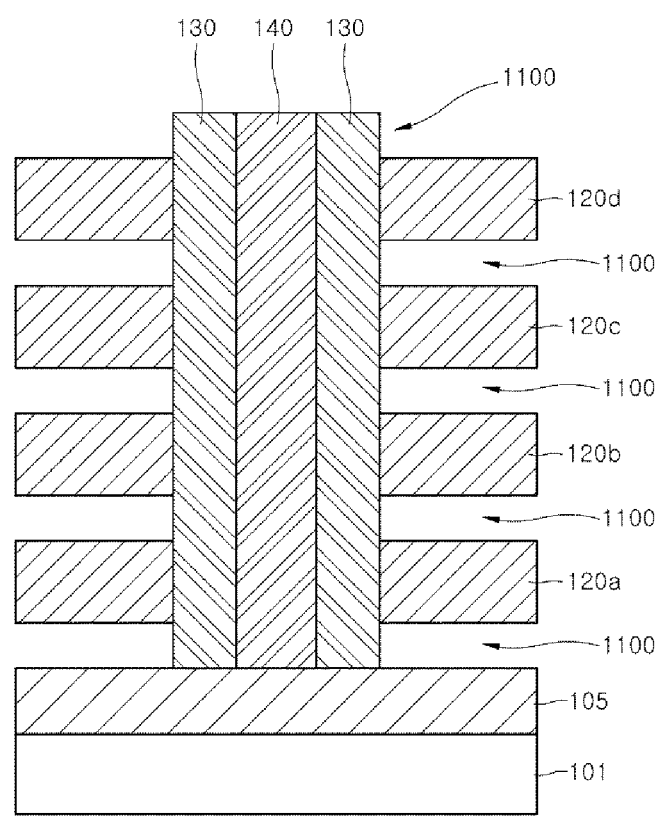

Referring to FIG. 11, the first interlayer sacrificial layers 110a, 110b, 110c, 110d and 110e may be selectively removed to form first recesses 1100 selectively exposing the channel layer 130. In an embodiment, the first interlayer sacrificial layers 110a, 110b, 110c, 110d and 110e may be selectively removed by wet etching using the etch selectivity between the first interlayer sacrificial layers 110a, 110b, 110c, 110d and 110e and the second interlayer sacrificial layers 120a, 120b, 120c and 120d. As a result, the first interlayer sacrificial layers 110a, 110b, 110c, 110d and 110e may be removed and the base insulation layer 105 and the second interlayer sacrificial layers 120a, 120b, 120c and 120d may be remained.

Figure 12:
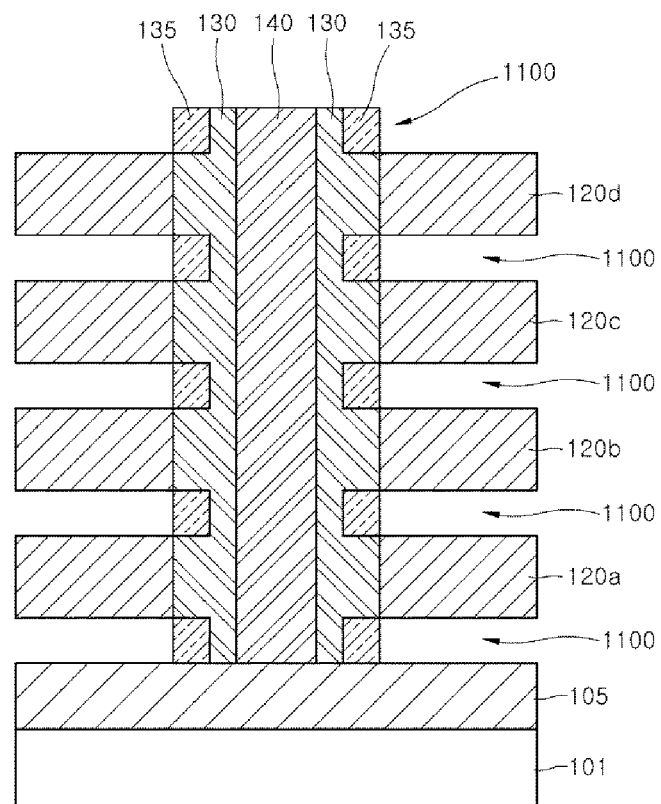

Referring to FIG. 12, a dopant may be injected into portions of the channel layer 130 selectively exposed by the first recesses 1100 to form channel doping regions 135. The dopant may be an n-type dopant or a p-type dopant. In an embodiment, a method of injecting the dopant may proceed as follows. A doping gas containing a predetermined dopant is provided into the first recesses 1100 so that the dopant is diffused into the exposed channel layer 130. At this time, a separate doping mask pattern may be additionally formed to selectively inject the dopant into a portion of the channel layer 130 above the uppermost second interlayer sacrifice layer 120d. In another embodiment, a method of injecting the dopant may proceed using a doped semiconductor layer as follows. A semiconductor layer doped with a predetermined dopant is formed on the channel layer 130 in the first recesses 1100. The semiconductor layer may include a material having etch selectivity with respect to the channel layer 130. Specifically, the doped semiconductor layer is formed common to the channel layer 130 and the second interlayer sacrificial layers 120a, 120b, 120c and 120d of FIG. 12. Here, the doped semiconductor layer may also be patterned to selectively inject the dopant into portions of the channel layer 130 located common to the uppermost second interlayer sacrificial layer 120d. A heat treatment process is performed to diffuse the dopant into the channel layer 130. Thereafter, the doped semiconductor layer is removed. A wet etching method using etching selectivity may be applied to remove the semiconductor layer, leaving channel doping regions 135 as illustrated in FIG. 12.

Figure 13:
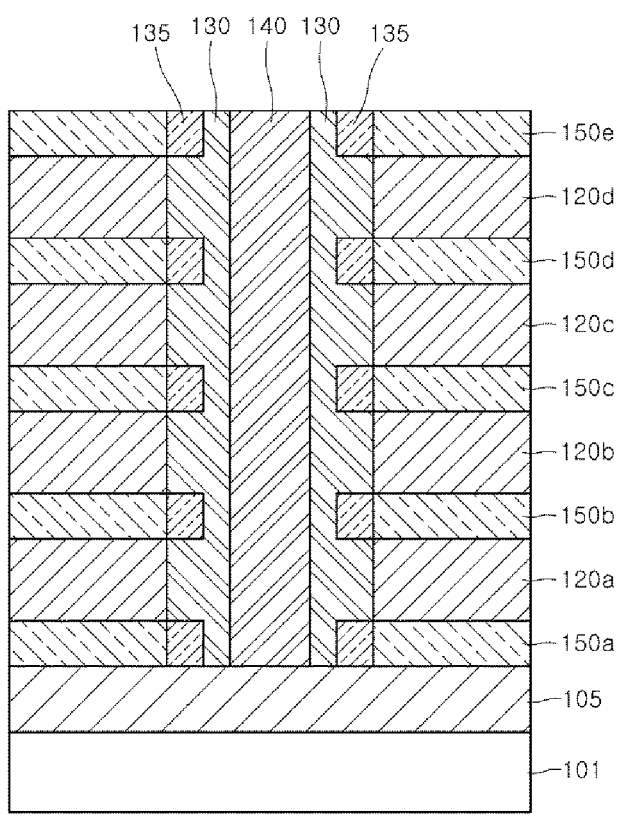

Referring to FIG. 13, the first recesses 1100 may be filled with a conductive material to form channel contact electrode layers 150a, 150b, 150c, 150d and 150e disposed apart from each other along the first direction, for example, the z-direction. The channel contact electrode layers 150a, 150b, 150c, 150d and 150e may each include a conductive material. As an example, the conductive material may include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The conductive material may have etch selectivity with respect to the second interlayer sacrificial layers 120a, 120b, 120c and 120d. As a method of forming the channel contact electrode layers 150a, 150b, 150c, 150d, and 150e, a chemical vapor deposition method or an atomic layer deposition method may be applied.

In some embodiments, after forming a thin film of conductive material on the second sacrificial layer 120d, the channel layer 130 and the filling insulation layer 140, a patterning process for the thin film may further be performed to form the channel contact electrode layer 150e located on the uppermost second interlayer sacrificial layer 120d.

Figure 14:
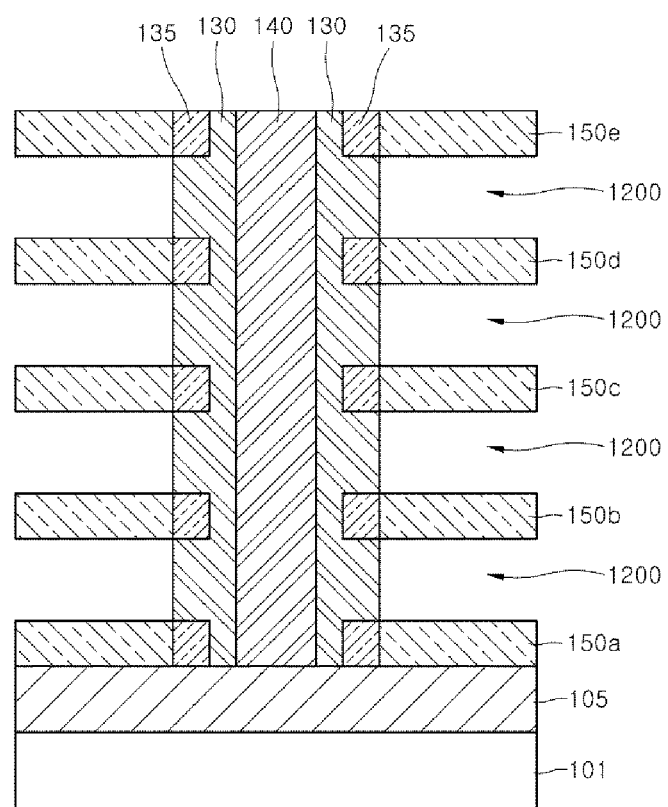

Referring to FIG. 14, the second interlayer sacrificial layers 120a, 120b, 120c and 120d may be selectively removed to form second recesses 1200 and to expose the channel layer 130. The second recesses 1200 may be formed by a wet etching method using etch selectivity between the second interlayer sacrificial layers 120a, 120b, 120c and 120d and the channel contact electrode layers 150a, 150b, 150c, 150d and 150e. As a result, the second recesses 1200, which are recessed spaces, may be formed between the channel contact electrode layers 150a, 150b, 150c, 150d and 150e.

Figure 15:
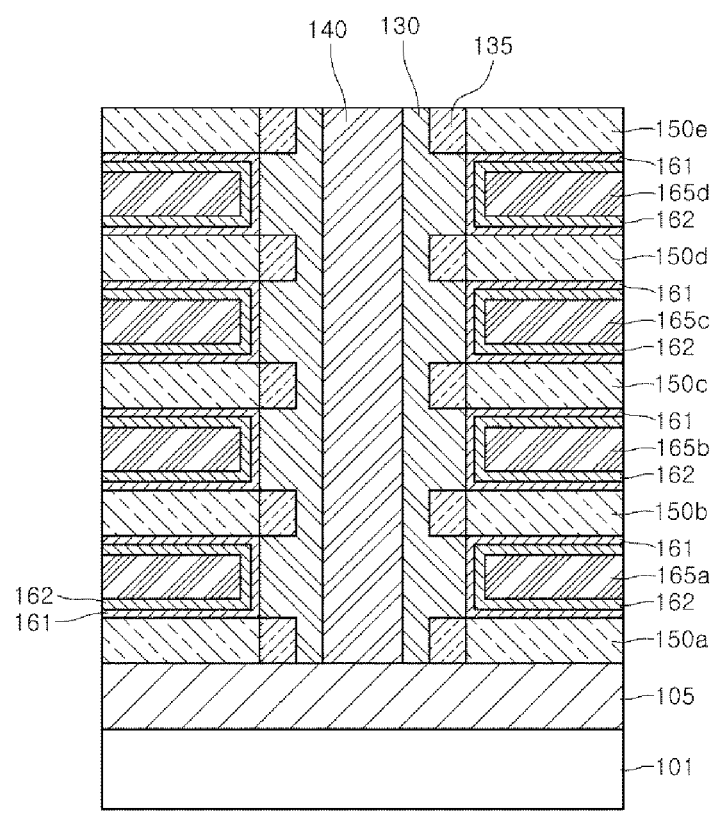

Referring to FIG. 15, interfacial insulation layers 161 may be formed on the channel contact electrode layers 150a, 150b, 150c, 150d and 150e and the channel layer 130 in the second recesses 1200. The interfacial insulation layers 161 may, for example, include silicon oxide, silicon nitride, silicon oxynitride or aluminum oxide. The interfacial insulation layers 161 may be formed, for example, by a chemical vapor deposition method or an atomic layer deposition method.

Ferroelectric layers 162 may be formed on the interfacial insulation layers 161. The ferroelectric layers 162 may, for example, include hafnium oxide, zirconium oxide, hafnium zirconium oxide or a combination of two or more thereof, as non-limiting examples. In the present disclosure, the ferroelectric materials contemplated for use in ferroelectric layers 162 are not limited to the above listed materials, and various other ferroelectric materials can be utilized. As an example, the ferroelectric layer 162 may include a ferroelectric material of a perovskite structure such as PZT(PbZr$_x$Ti$_{1-x}$O$_3$), BaTiO3, PbTiO3 or the like. The ferroelectric layers 162 may each include at least one dopant selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La). The ferroelectric layer 162 may have a crystalline state.

The ferroelectric layers 162 may be formed, for example, using a chemical vapor deposition method or an atomic layer deposition method. In an embodiment, the ferroelectric layers 162 may each be formed in a crystalline state. In another embodiment, the ferroelectric layers 162 may each be formed in an amorphous state, and then may each be converted into a crystalline state through crystallization heat treatment.

Gate electrode layers 165a, 165b, 165c and 165d may be formed on the ferroelectric layers 162. The gate electrode layers 165a, 165b, 165c and 165d may each include a conductive material. As an example, the conductive material may include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In an embodiment, after sequentially forming the interfacial insulation layers 161, the ferroelectric layers 162 and the gate electrode layers 165a, 165b, 165c and 165d, a patterning process for the interfacial insulation layers 161, the ferroelectric layers 162 and the gate electrode layers 165a, 165b, 165c and 165d may be performed. As a result, the interfacial insulation layers 161, the ferroelectric layers 162 and the gate electrode layers 165a, 165b, 165c and 165d formed on the channel layer 130, the filling insulation layer 140 and the uppermost channel contact electrode layer 150e are formed. As a result, the vertical memory device illustrated in FIG. 15 can be fabricated.

FIGS. 16 to 25 are cross-sectional views schematically illustrating a method of fabricating a vertical memory device according to an embodiment of the present disclosure. The method of fabricating the vertical memory device described below with reference to FIGS. 16 to 25 may be a method of fabricating the vertical memory device 2 described above and with reference to FIGS. 4 and 5.

Figure 16:
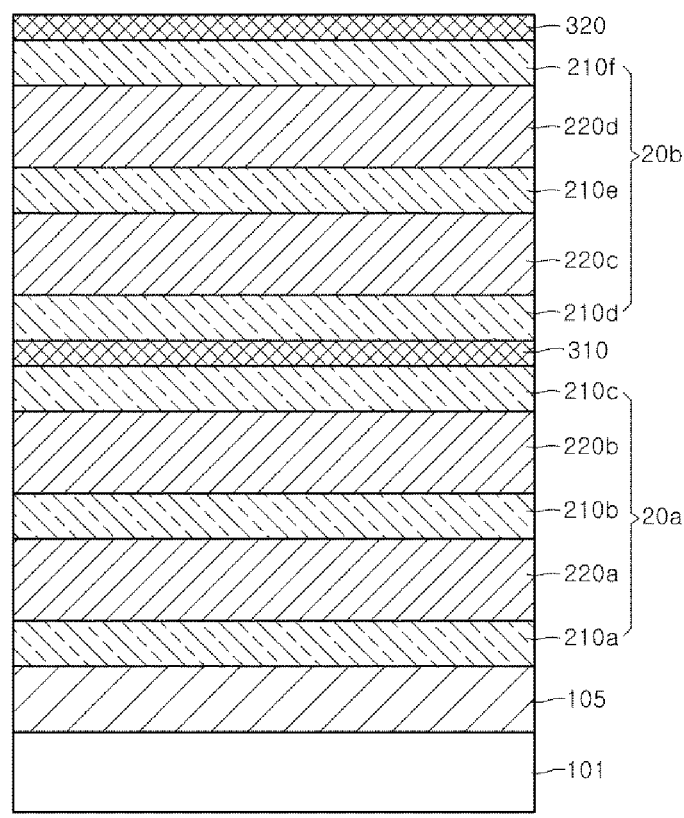
FIGS. 16 to 25 are cross-sectional views schematically illustrating a method of fabricating a vertical memory device according to an embodiment of the present disclosure.

Referring to FIG. 16, a base insulation layer 105 may be formed on a substrate 101. A first stack structure 20a may be formed on the base insulation layer 105. The first stack structure 20a may include first interlayer sacrificial layers 210a, 210b and 210c and second interlayer sacrificial layers 220a and 220b, which are alternately stacked. In an embodiment, a lowermost layer of the first stack structure 20a in contact with the base insulation layer 105 and an uppermost layer of the first stack structure 20a may be the first interlayer sacrificial layers 210a and 210c, respectively. Here, the first interlayer sacrificial layer 210a as the lowermost layer may have etch selectivity with respect to the base insulation layer 105. The first interlayer sacrificial layers 210a, 210b and 210c and the second interlayer sacrificial layers 220a and 220b may be formed, for example, by a coating method, a chemical vapor deposition method, an atomic layer deposition and so on.

Then, a third interlayer sacrificial layer 310 may be formed on the first stack structure 20a. The third interlayer sacrificial layer 310 may have etch selectivity with respect to the first interlayer sacrificial layers 210a, 210b and 210c and the second interlayer sacrificial layers 220a and 220b. As an example, the first interlayer sacrificial layers 210a, 210b and 210c may each include oxide, the second interlayer sacrificial layers 220a and 220b may each include nitride, and the third interlayer sacrificial layer 310 may include silicon (Si). As another example, the first interlayer sacrificial layers 210a, 210b and 210c may each include nitride, the second interlayer sacrificial layers 220a and 220b may each include oxide, and the third interlayer sacrificial layer 310 may include silicon (Si). The third interlayer sacrificial layer 310 may be formed, for example, by a coating method, a chemical vapor deposition method, an atomic layer deposition method and on the like.

A second stack structure 20b may be formed on the third interlayer sacrificial layer 310. The second stack structure 20b may include first interlayer sacrificial layers 210d, 210e and 210f and second interlayer sacrificial layers 220c and 220d, which are alternately stacked. The configurations of the first interlayer sacrificial layers 210d, 210e and 210f and the second interlayer sacrificial layers 220c and 220d may be substantially the same as the configurations of the first interlayer sacrificial layers 210a, 210b and 210c and the second interlayer sacrificial layers 220a and 220b of the first stack structure 20a.

Another third interlayer sacrificial layer 320 may be formed on the second stack structure 20b. A configuration of the third interlayer sacrificial layer 320 may be substantially the same as a configuration of the third interlayer sacrificial layer 310 of the first stack structure 20a.

Figure 17:
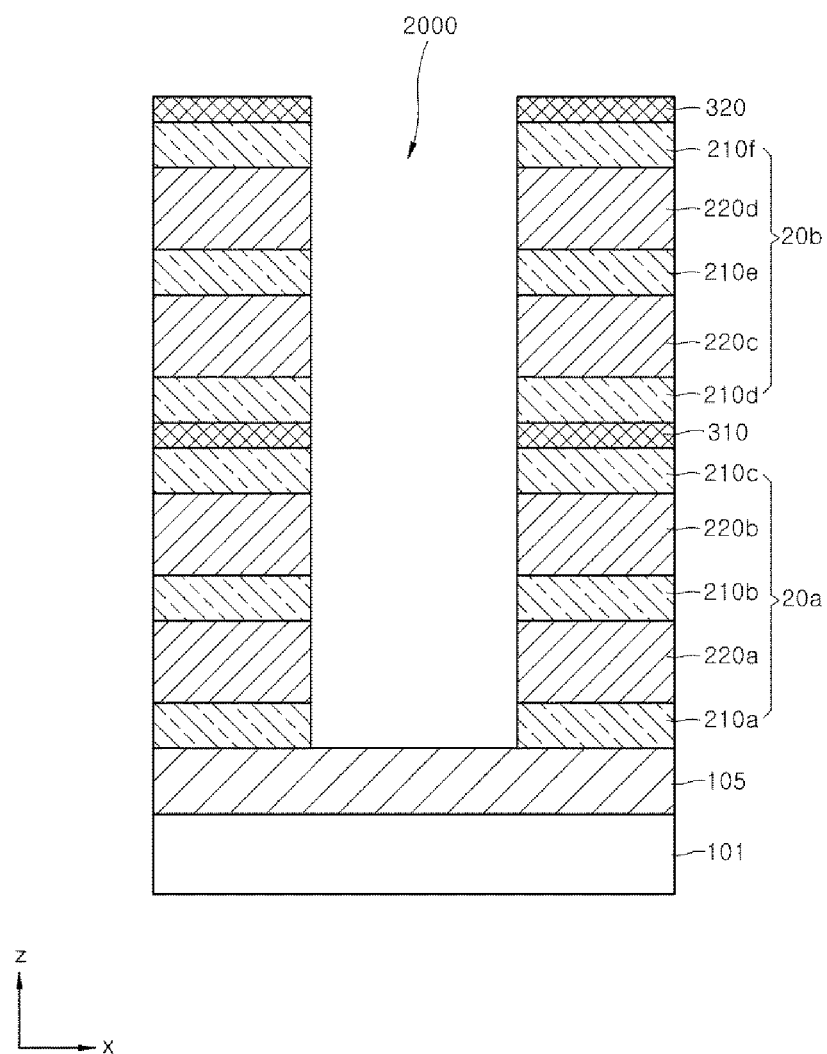

Referring to FIG. 17, a trench 2000 may be formed to penetrate the first stack structure 20a, the third interlayer sacrificial layer 310, the second stack structure 20b and the third interlayer sacrificial layer 320. As a result, along a sidewall surface of the trench 2000, the first interlayer sacrificial layers 210a, 210b, 210c, 210d, 210e and 210f, the second interlayer sacrificial layers 220a, 220b, 220c and 220d and the third interlayer sacrificial layers 310 and 320 may be exposed. The base insulation layer 105 may be exposed along a bottom surface of the trench 2000. The trench 2000 may have well-like shape, and may substantially circular or elliptical perimeters in cross-sections. As a method of forming the trench 2000, anisotropic etching may be applied.

Figure 18:
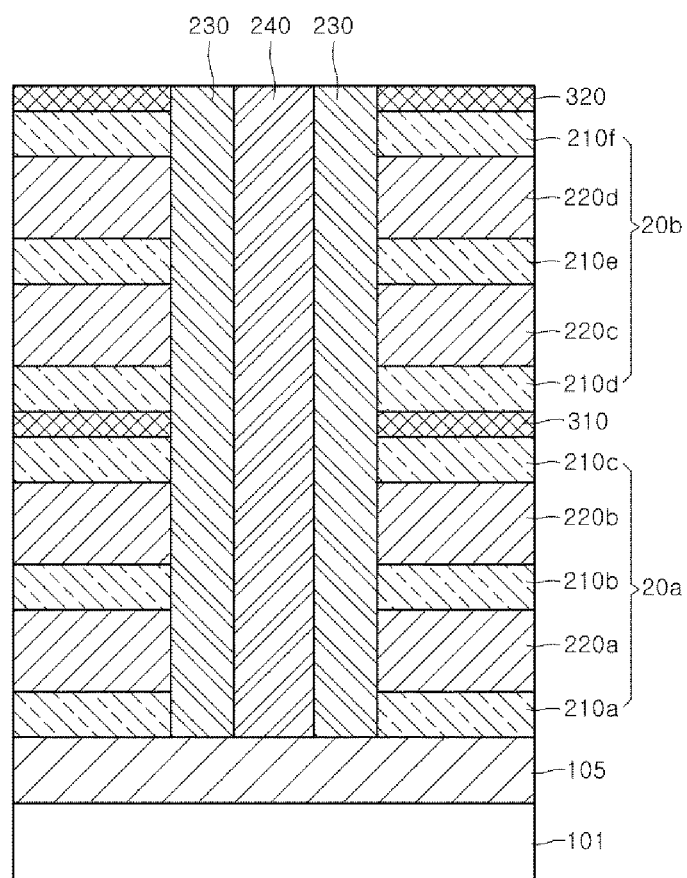

Referring to FIG. 18, a channel layer 230 may be formed to cover the sidewall surface of the trench 2000. A configuration and method of forming the channel layer 230 may be substantially the same as the configuration and method of forming the channel layer 130 described above and with reference to FIG. 10.

The trench 2000, in which the channel layer 230 is formed, may be filled with an insulative material to form a filling insulation layer 240. A configuration and a method forming the filling insulation layer 240 may be substantially the same as the configuration and forming method of the filling insulation layer 140 described above with reference to FIG. 10.

As a result, as illustrated in FIG. 18, a structure in which upper surfaces of the channel layer 230, the filling insulation layer 240 and the third sacrificial insulation layer 320 are substantially planar can be formed.

Figure 19:
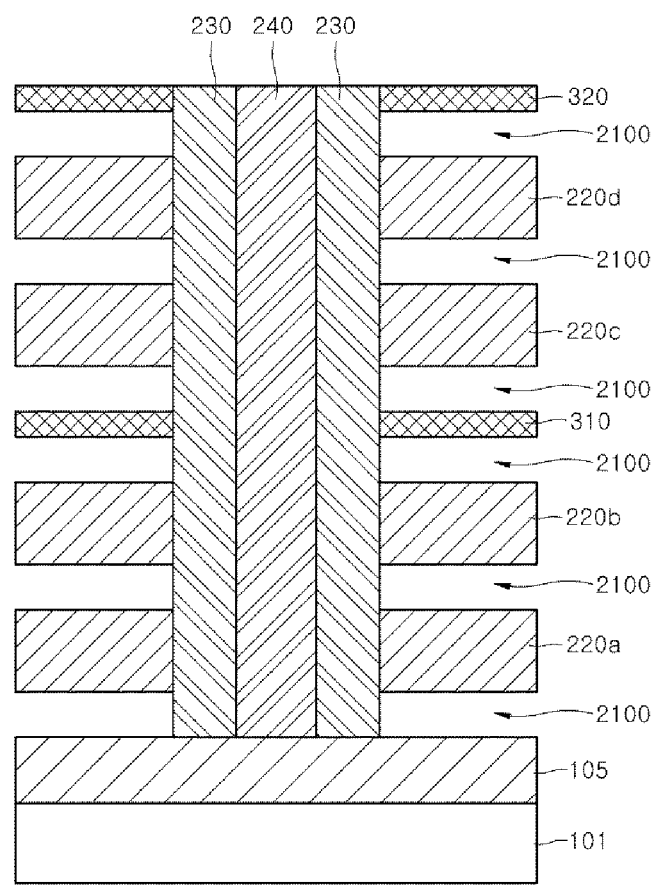

Referring to FIG. 19, the first interlayer sacrificial layers 210a, 210b, 210c, 210d, 210e and 210f may be selectively removed to form first recesses 2100. A method of forming the first recesses 2100 may be substantially the same as the method of forming the first recesses 1100 described above and with reference to FIG. 11. While the first interlayer sacrificial layers 210a, 210b, 210c, 210d, 210e and 210f are removed, the second interlayer sacrificial layers 220a, 220b, 220c and 220d and the third interlayer sacrificial layers 310 and 320 may not be removed.

Figure 20:
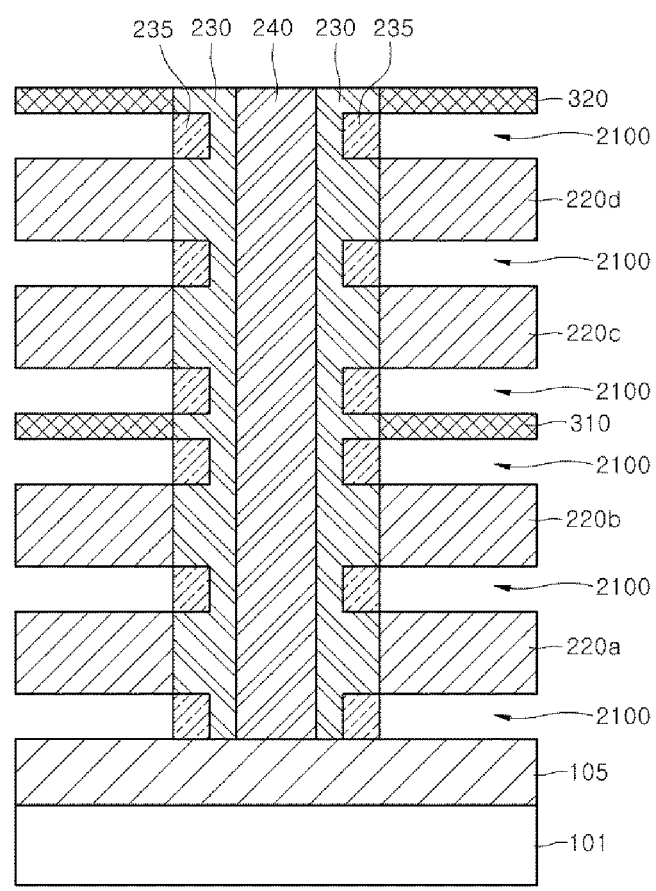

Referring to FIG. 20, a dopant may be injected into portions of the channel layer 230, which are selectively exposed by the first recesses 2100, to form channel doping regions 235. A method of forming the channel doping regions 235 may be substantially the same as the method of forming the channel doping regions 135 described above and with reference to FIG. 12. At this time, in order to prevent doping of surface portions of the channel layer 230 and the filling insulation layer 240 extending in a first direction, for example, the z-direction, a separate doping mask pattern may be formed on the channel layer 230, the filling insulation layer 240 and the third interlayer sacrificial layer 320, and then, a dopant implantation process may be applied. After the dopant implantation process is completed, the doping mask pattern may be removed.

Figure 21:
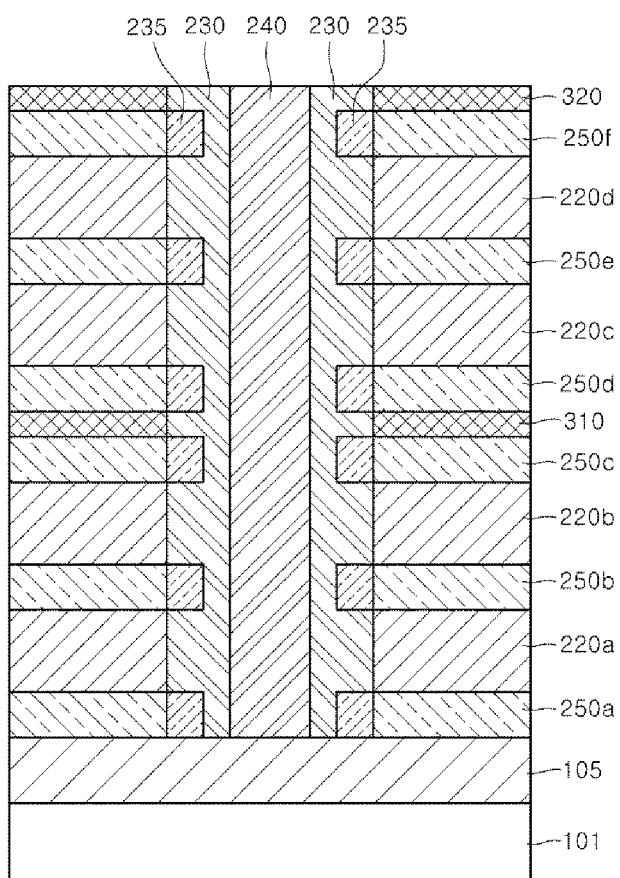

Referring to FIG. 21, the first recesses (2100 of FIG. 20) may be filled with a conductive material to form channel contact electrode layers 250a, 250b, 250c, 250d, 250e and 250f that are disposed apart from each other along the first direction, for example, the z-direction. In some embodiments, the conductive material formed on the third interlayer sacrificial layer 320 may be removed using anisotropic etch-back or chemical mechanical polishing.

Figure 22:
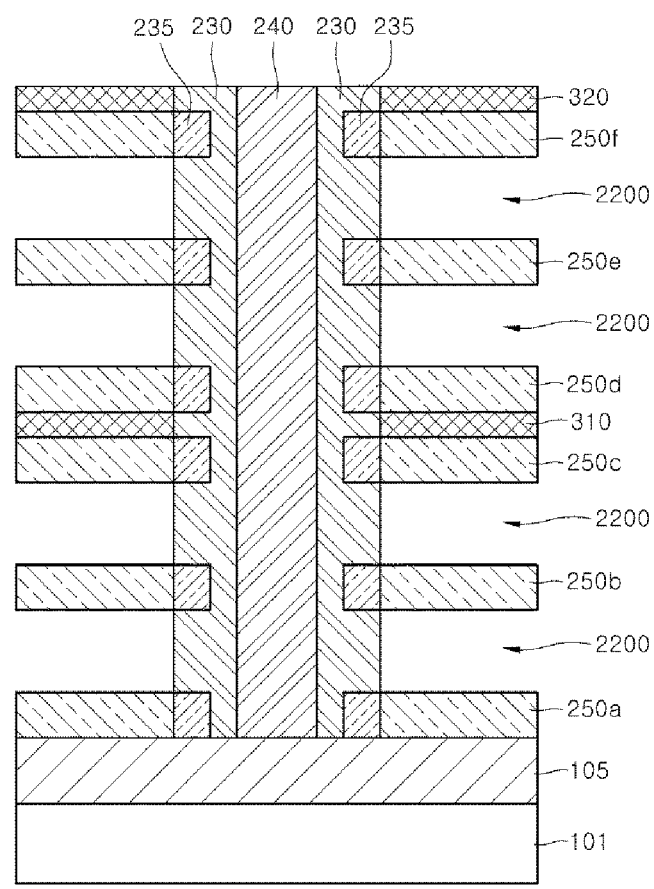

Referring to FIG. 22, the second interlayer sacrificial layers 220a, 220b, 220c and 220d may be selectively removed to form second recesses 2200 exposing the channel layer 230. A method of forming the second recesses 2200 may be substantially the same as the method of forming the second recesses 1200 described above and with reference to FIG. 14. While the second interlayer sacrificial layers 220a, 220b, 220c and 220d are removed, the third interlayer sacrificial layers 310 and 320 and the channel contact electrode layers 250a, 250b, 250c, 250d, 250e and 250f are not removed.

Figure 23:
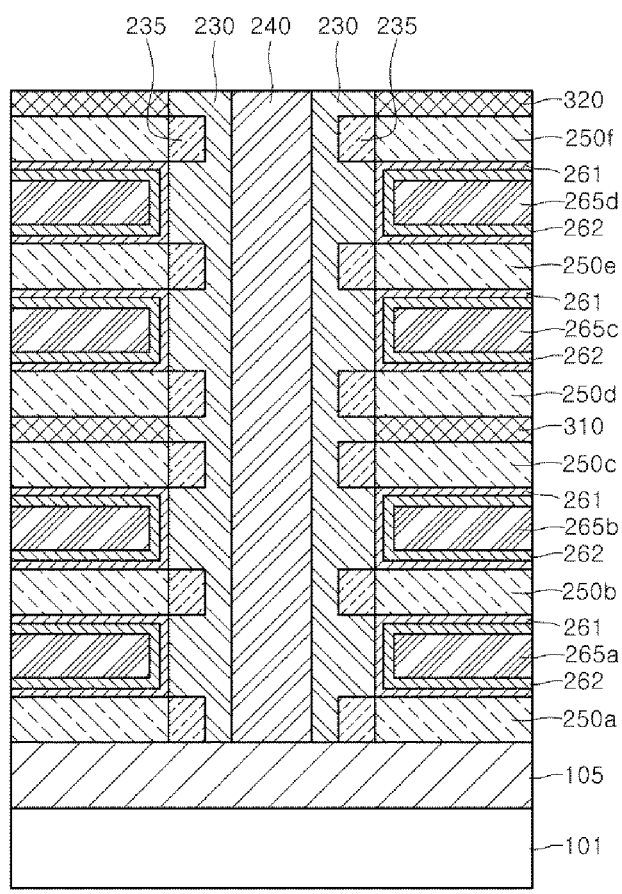

Referring to FIG. 23, interfacial insulation layers 261 may be formed on the channel contact electrode layers 250a, 250b, 250c, 250d, 250e and 250f and the channel layer 230 in the second recesses (2200 of FIG. 22). Then, ferroelectric layers 262 and gate electrode layers 265a, 265b, 265c and 265d may be formed on the interfacial insulation layers 261. Methods of forming the interfacial insulation layers 261, the ferroelectric layers 262 and the gate electrode layers 265a, 265b, 265c and 265d may be substantially the same as methods of forming the interfacial insulation layers 161, the ferroelectric layers 162 and the gate electrode layers 165a, 165b, 165c and 165d described above and with reference to FIG. 15.

In an embodiment, after the interfacial insulation layers 261, the ferroelectric layers 262 and the gate electrode layers 265a, 265b, 265c and 265d are sequentially formed, the interfacial insulation layers 261, the ferroelectric layers 262 and the gate electrode layers 265a, 265b, 265c and 265d, a top surface portion of the filling insulation layer 240 and the third interlayer sacrificial layer 320 may be removed.

Figure 24:
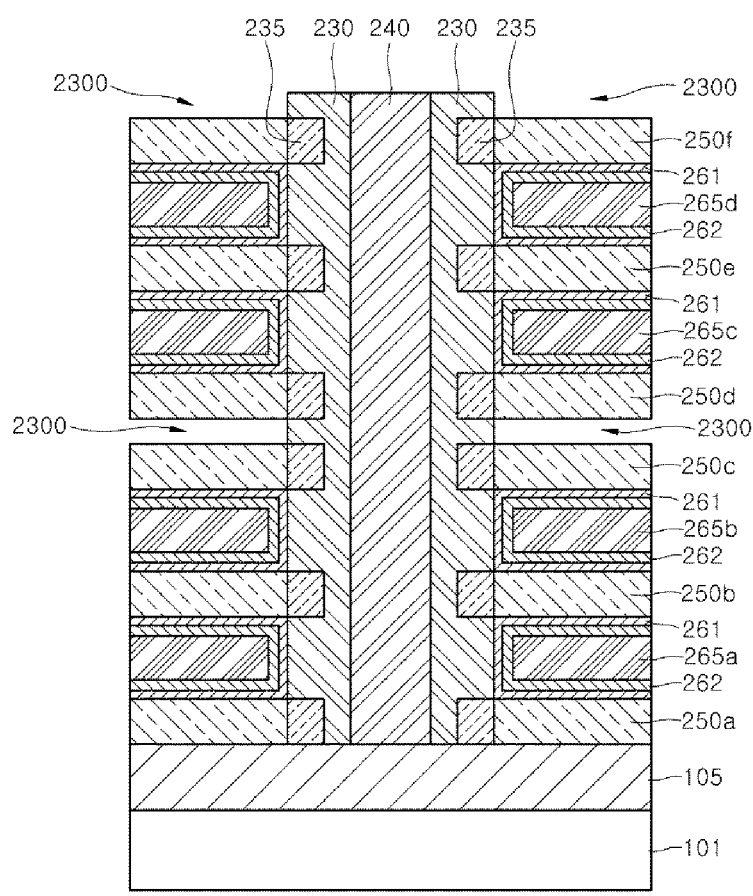

Referring to FIG. 24, the third interlayer sacrificial layers 310 and 320 may be selectively removed to form third recesses 2300 exposing the channel layer 230. Third recesses 2300 can be formed using wet etching.

Figure 25:
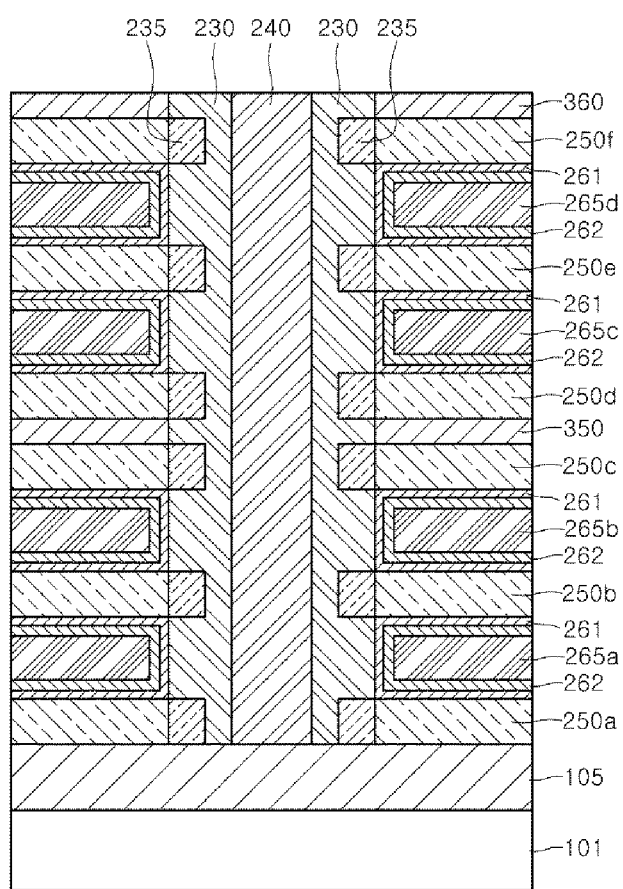

Referring to FIG. 25, the third recesses 2300 may be filled with an insulative material to form first and second device insulation layers 350 and 360. A method of filling the third recesses 2300 with the insulative material may be performed, for example, using a coating method, a chemical vapor deposition method, or an atomic layer deposition method. By performing the above-described processes, the vertical memory device according to an embodiment can be fabricated.

Figure 26:
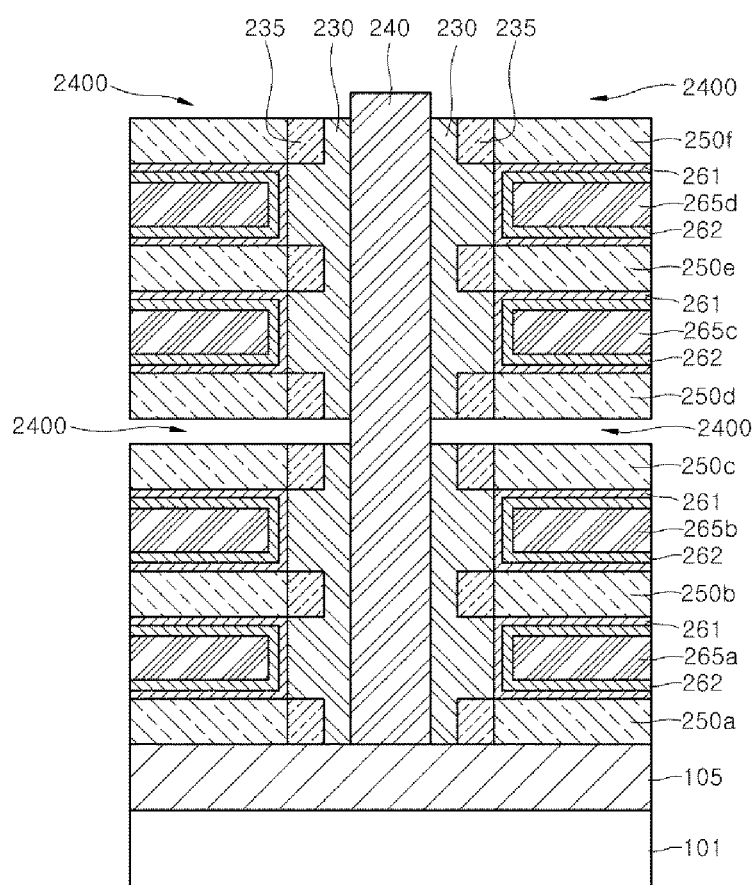
FIGS. 26 and 27 are cross-sectional views schematically illustrating a method of fabricating a vertical memory device according to an embodiment of the present disclosure.
Figure 27:
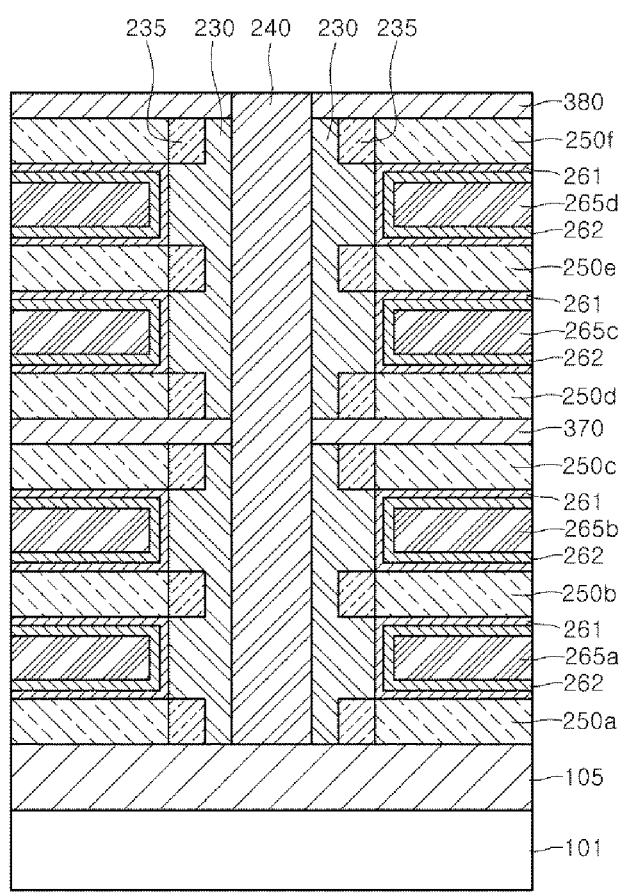

FIGS. 26 and 27 are cross-sectional views schematically illustrating a method of fabricating a vertical memory device according to an embodiment of the present disclosure. In an embodiment, first, the fabrication methods described above with reference to FIGS. 16 to 23 is performed to form the stack structure of FIG. 23.

Then, as illustrated in FIG. 26, third interlayer sacrificial layers 310 and 320 may be selectively removed to expose a portion of channel layer 230. Then, the exposed channel layer 230 may further be removed in a second direction, for example, in the x-direction to form third recesses 2400 in which the third interlayer sacrificial layers 310 and 320 and the channel layer 230 are removed.

Referring to FIG. 27, the third recesses 2400 may be filled with an insulative material to form first and second device insulation layers 370 and 380. By performing the above-described processes, the vertical memory device according to an embodiment can be fabricated.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:
1. A vertical memory device comprising:
   a substrate;
   a first gate electrode structure disposed on the substrate and a second gate electrode structure spaced apart from the first gate electrode structure in a first direction substantially perpendicular to the substrate, each of the first gate electrode structure and the second gate electrode structure including a ferroelectric layer and a gate electrode layer;

a channel contact electrode layer disposed between the first gate electrode structure and the second gate electrode structure; and a channel layer extending along the first direction and in contact with the channel contact electrode layers and the first and the second gate electrode structures, wherein at least a portion of each of the ferroelectric layers is disposed between the channel contact electrode layer and the gate electrode layer.

2. The vertical memory device of claim 1, wherein the channel contact electrode layers comprise:

a source electrode layer disposed at a first end of any one of the first and the second gate electrode structures; and a drain electrode layer disposed at a second end of the any one of the first and the second gate electrode structures.

3. The vertical memory device of claim 2, wherein the drain electrode layer is connected to a bit line, the source electrode layer is connected to a ground line, and the gate electrode layer is connected to a word line.

4. The vertical memory device of claim 1, wherein at least a portion of each of the ferroelectric layers is disposed between the channel layer and the gate electrode layer.

5. The vertical memory device of claim 1, further comprising:

an interfacial insulation layer disposed between the channel contact electrode layer and the ferroelectric layer and disposed between the channel layer and the ferroelectric layer.

6. The vertical memory device of claim 1, further comprising:

a device insulation layer disposed between the channel contact electrode layer in contact with the first gate electrode structure and the channel contact electrode layers in contact with the second gate electrode structure.

7. The vertical memory device of claim 1, further comprising:

a channel doping region disposed in at least one region of the channel layer in contact with the channel contact electrode layers.

8. The vertical memory device of claim 1, wherein the ferroelectric layer comprises at least one selected from the group consisting of hafnium oxide, zirconium oxide, and hafnium zirconium oxide.

9. The vertical memory device of claim 8, wherein the ferroelectric layer comprises at least one dopant selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La).

10. The vertical memory device of claim 1, wherein the channel contact electrode layer comprises at least one dopant selected from the group consisting of tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, and ruthenium oxide.

11. A vertical memory device comprising:

a substrate;

a first gate electrode structure disposed on the substrate and a second gate electrode structure spaced apart from the first gate electrode structure in a first direction substantially perpendicular to the substrate, each of the first gate electrode structure and the second gate electrode structure including a ferroelectric layer and a gate electrode layer;

a channel contact electrode layer disposed between the first gate electrode structure and the second gate electrode structure;

a channel layer extending along the first direction and in contact with the channel contact electrode layers and the first and the second gate electrode structures; and an interfacial insulation layer disposed between the channel contact electrode layer and the ferroelectric layer and disposed between the channel layer and the ferroelectric layer.

12. A vertical memory device comprising:

a substrate;

a first gate electrode structure disposed on the substrate and a second gate electrode structure spaced apart from the first gate electrode structure in a first direction substantially perpendicular to the substrate, each of the first gate electrode structure and the second gate electrode structure including a ferroelectric layer and a gate electrode layer;

a channel contact electrode layer disposed between the first gate electrode structure and the second gate electrode structure;

a channel layer extending along the first direction and in contact with the channel contact electrode layers and the first and the second gate electrode structures; and a device insulation layer disposed between the channel contact electrode layer in contact with the first gate electrode structure and the channel contact electrode layers in contact with the second gate electrode structure.

* * * * *